(12) United States Patent
Park

(10) Patent No.: US 6,979,368 B2
(45) Date of Patent: Dec. 27, 2005

(54) APPARATUS AND METHOD FOR PRODUCING A SEMICONDUCTOR DEVICE INCLUDING A BYPRODUCT CONTROL SYSTEM

(75) Inventor: Jun-Sig Park, Kyungki-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 148 days.

(21) Appl. No.: 10/771,748

(22) Filed: Feb. 3, 2004

(65) Prior Publication Data

US 2004/0154746 A1 Aug. 12, 2004

(30) Foreign Application Priority Data

Feb. 5, 2003 (KR) .................. 10-2003-0007157

(51) Int. Cl.[7] .................... C23C 16/48; C23F 1/00; H01L 21/306
(52) U.S. Cl. .................... 118/715; 156/345.29
(58) Field of Search .................. 118/715; 156/345.29

(56) References Cited

U.S. PATENT DOCUMENTS

| | | | | |
|---|---|---|---|---|
| 4,608,063 A | * | 8/1986 | Kurokawa | 118/728 |
| 4,940,213 A | * | 7/1990 | Ohmine et al. | 266/152 |
| 5,827,370 A | * | 10/1998 | Gu | 118/715 |
| 5,928,428 A | * | 7/1999 | Horie | 118/724 |
| 6,159,298 A | * | 12/2000 | Saito | 118/715 |
| 6,187,072 B1 | * | 2/2001 | Cheung et al. | 422/168 |
| 6,193,802 B1 | * | 2/2001 | Pang et al. | 118/715 |
| 6,194,628 B1 | * | 2/2001 | Pang et al. | 118/639 |
| 6,197,119 B1 | * | 3/2001 | Dozoretz et al. | 118/715 |
| 6,238,514 B1 | * | 5/2001 | Gu | 156/345.29 |
| 6,361,607 B2 | * | 3/2002 | Dozoretz et al. | 118/715 |
| 6,383,300 B1 | * | 5/2002 | Saito et al. | 118/715 |
| 6,517,913 B1 | * | 2/2003 | Cheung et al. | 427/588 |
| 6,680,420 B2 | * | 1/2004 | Pang et al. | 118/639 |
| 6,689,930 B1 | * | 2/2004 | Pang et al. | 134/1.1 |
| 6,807,971 B2 | * | 10/2004 | Saito et al. | 134/22.11 |
| 6,844,273 B2 | * | 1/2005 | Kato et al. | 438/791 |

* cited by examiner

Primary Examiner—Rudy Zervigon
(74) Attorney, Agent, or Firm—Marger Johnson & McCollom, P.C.

(57) ABSTRACT

An apparatus includes a reaction chamber installed in a reaction furnace; a discharge port for removing from the reaction chamber reaction byproducts formed during producing of the semiconductor device; a heater for generating heat to the reaction chamber; and a hot fluid supply unit for introducing heat from the heater and the reaction chamber into the discharge port. The hot fluid supply unit further comprises a fluid container for receiving a heat transfer fluid. The apparatus includes a hot fluid generator adjacent the reaction chamber in the reaction furnace. The hot fluid generator defines a fluid channel for conveying the heat transfer fluid and transfers heat generated from the heater and the reaction chamber to the heat transfer fluid supplied from the fluid container. The apparatus also includes a heat transfer element for transferring heat to the discharge port using the heat transfer fluid supplied from the hot fluid generator.

21 Claims, 6 Drawing Sheets

APPARATUS AND METHOD FOR PRODUCING A SEMICONDUCTOR DEVICE INCLUDING A BYPRODUCT CONTROL SYSTEM

BACKGROUND OF THE INVENTION

This application claims priority from Korean Patent Application No. 2003-7157, filed on Feb. 5, 2003, in the Korean Intellectual Property Office, the disclosure of which is incorporated herein by reference in its entirety.

1. Field of the Invention

The present invention relates to an apparatus and method for producing a semiconductor device, and more particularly, to an apparatus and method for producing a semiconductor device including a system capable of controlling certain byproducts formed during the semiconductor production process.

2. Description of the Related Art

In the chemical vapor deposition process (CVD) employed in semiconductor device fabrication, various reaction gases are used according to the reaction condition and the types of treatment gases.

Accordingly, various byproducts are formed by chemical reaction of these reaction gases some of which are undesirable. For example, when $NH_3$ and dichlorosilane (DCS) are the gases that react with each other in a reaction chamber, at a relatively high temperature of 650° C. or more and a pressure of $10^{-2}$ torr, a desired silicon nitride film ($Si_3N_4$) is deposited.

However, at the same time, ammonium chloride ($NH_4Cl$) is generated as a byproduct. $NH_4Cl$ is a white, odorless, crystalline substance formed by the reaction of gaseous ammonia ($NH_3$) and hydrochloric acid (HCl). It is mainly formed at the outlet portion of a reaction chamber or a vacuum pipe, which has a relatively low temperature.

Therefore, as the deposition process proceeds, powdery $NH_4Cl$ is accumulated at the outlet portion of the reaction chamber or the vacuum pipe. As the deposition process continues, the outlet portion of the reaction chamber and the vacuum pipe become clogged.

As a result, the accumulated $NH_4Cl$ flows backward into the reaction chamber. As the amount of the accumulated $NH_4Cl$ increases in the reaction chamber, the effective inner diameter of the outlet portion of the reaction chamber and the vacuum pipe decreases. Then, the volume of the exhaust gas changes. As a result of these differences caused by the presence of excess $NH_4Cl$, a pressure change takes place within the reaction chamber.

Conventionally, in the deposition of a silicon nitride film, the reaction chamber and the vacuum pipe are periodically cleaned to remove the $NH_4Cl$ byproduct. However, if the use of equipment for cleaning the reaction chamber is circumvented, an increase of production loss and working expense is incurred.

In attempts to overcome this problem, there have been methods of preventing the generation of $NH_4Cl$, channeling the generated $NH_4Cl$ toward an area away from a reaction chamber, and exhausting the generated $NH_4Cl$ through the back side of a vacuum pump.

FIGS. 1 and 2 are illustrative views of an apparatus for manufacturing a semiconductor device having a construction capable of preventing the generation of $NH_4Cl$ according to an example of the prior art. FIG. 2 is an enlarged view of the part of "A" of FIG. 1.

Referring to FIGS. 1 and 2, the deposition of a silicon nitride film is performed using DCS and $NH_3$ in a reaction chamber 12 installed in a vertical-type reaction furnace 10. During the deposition, in order to prevent the accumulation of a $NH_4Cl$ byproduct in the outlet portion of the reaction chamber 12 and in the discharge port 14, a heating jacket 70 or a heating coil (not shown) is installed around sections in which a temperature drastically drops, i.e., the "A" part surrounding the discharge port 14, the "B" part between the discharge port 14 and a vacuum pipe 20 connected to a vacuum pump 60, and the "C" part surrounding the vacuum pipe 20.

Such a heating jacket or heating coil serves to maintain the above sections at a temperature of about 150° C. In FIG. 1, a reference numeral 16 denotes a heater for heating the reaction chamber 12 to a temperature required for the deposition and a reference numeral 50 denotes a utility box.

In a method using such a heating jacket 70, as shown in FIG. 2, an external heat is applied to the outer surfaces of the discharge port 14 and the vacuum pipe 20. Therefore, the outlet portion of the reaction chamber 12, the inner portion of the discharge port 14, and the inner portion of the vacuum pipe 20 are indirectly heated and kept warm.

As a result, $NH_4Cl_4$ can be prevented from being accumulated in the reaction chamber 12 and the discharge port 14. However, because the heating jacket 70 generates heat using a heating coil inserted in an outer insulating shell made of asbestos or a flexible synthetic silicon material, a high manufacturing cost is incurred.

In addition, various problems such as breakage of the heating coil during use and degradation due to the presence of water during the cleaning operation may occur. Therefore, an average life span of the heating jacket 70 is about a year. In addition, because overheating may cause a fire hazard, installation and management of separate fire safety equipment are required.

As a direct heating method, there is adopted a method for supplying a hot $N_2$ gas into a discharge port of a reaction chamber to prevent the accumulation of a byproduct in a vacuum pipe. FIG. 3 is an illustrative view of an apparatus for manufacturing a semiconductor device having a construction capable of preventing the generation of $NH_4Cl$ by supplying a hot $N_2$ gas according to another example of the prior art. In FIG. 3, the same reference numerals as in FIGS. 1 and 2 denotes the same constitutional elements.

Referring to FIG. 3, a hot $N_2$ generator 80 as a separate heating unit is installed outside deposition equipment. When a room temperature $N_2$ gas passes through the hot $N_2$ generator 80, a hot $N_2$ gas with a temperature of 50° C. or more is generated. The generated hot $N_2$ gas is supplied into the outlet portion of the reaction chamber 12 or the discharge port 14, which has a lower temperature. According to this method, the inner portions of the vacuous reaction chamber 12 and discharge port 14 are heated by the hot $N_2$ gas, and thus, $NH_4Cl$ is prevented from being accumulated in the reaction chamber 12 and the discharge port 14.

However, the hot $N_2$ generator 80 is very expensive. Also, in order to separately install such a heating unit outside the deposition equipment, additional costs such as a high installation cost and working expense are required, in addition to the limitation of the available installation space.

In such conventional semiconductor device manufacturing apparatuses as described above with reference to FIGS. 1 through 3, a separate expensive unit such as a heating jacket and a hot $N_2$ generator for heating the outlet portion of a reaction chamber, a discharge port, or a vacuum pipe is required. In addition, together with a separate space for installation of such a unit, additional cost for separate electric equipment installation and working expense are required.

SUMMARY OF THE INVENTION

According to an aspect of the present invention, an apparatus for manufacturing a semiconductor device comprises a reaction chamber installed in a reaction furnace; a discharge port for removing from the reaction chamber reaction byproducts formed during producing of the semiconductor device; a heater for applying heat to the reaction chamber; and a hot fluid supply unit for supplying heat generated from the heater and the reaction chamber to the discharge port. The hot fluid supply unit includes a fluid container for receiving a heat transfer fluid. The apparatus further comprises a hot fluid generator installed near the reaction chamber in the reaction furnace. The hot fluid generator may be formed of a fluid channel for conveying the heat transfer fluid. The hot fluid generator transfers heat generated from the heater and the reaction chamber to the heat transfer fluid supplied from the fluid container. The apparatus also includes a heat transfer element for transferring heat to the discharge port, using the heat transfer fluid supplied from the hot fluid generator.

The hot fluid generator may be formed of multiple fluid channels, each of which has an on/off valve for opening or closing a passage of the heat transferfluid.

The hot fluid generator may be installed at an upper portion or a side portion of the reaction chamber in the reactionfurnace.

When the heat transfer fluid is a gas, the heat transfer element may comprise nozzles for supplying the heat transfer fluid to the discharge port and the vacuum pipe.

The apparatus may further comprise a utility box containing the fluid container. The first pipe may comprise a flow control element for controlling a flow rate of the heat transfer fluid. The flow control element may be a mass flow controller (MFC) or a flow meter.

The apparatus may comprise a thermocouple for sensing and monitoring the temperature of the heat transfer fluid from the hot fluid generator.

The apparatus may comprise a main controller for opening or closing an on/off valve formed at the multiple fluid channels based on temperature of the heat transfer fluid which is sensed by the thermocouple.

The semiconductor device manufacturing apparatus of the present invention can prevent the generation of byproducts during a thin film deposition process, using the heat generated in the reaction chamber, without external heat supply, in an inexpensive and efficient manner. Therefore, a thin film with high quality can be deposited on a wafer and deposition efficiency can be increased.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
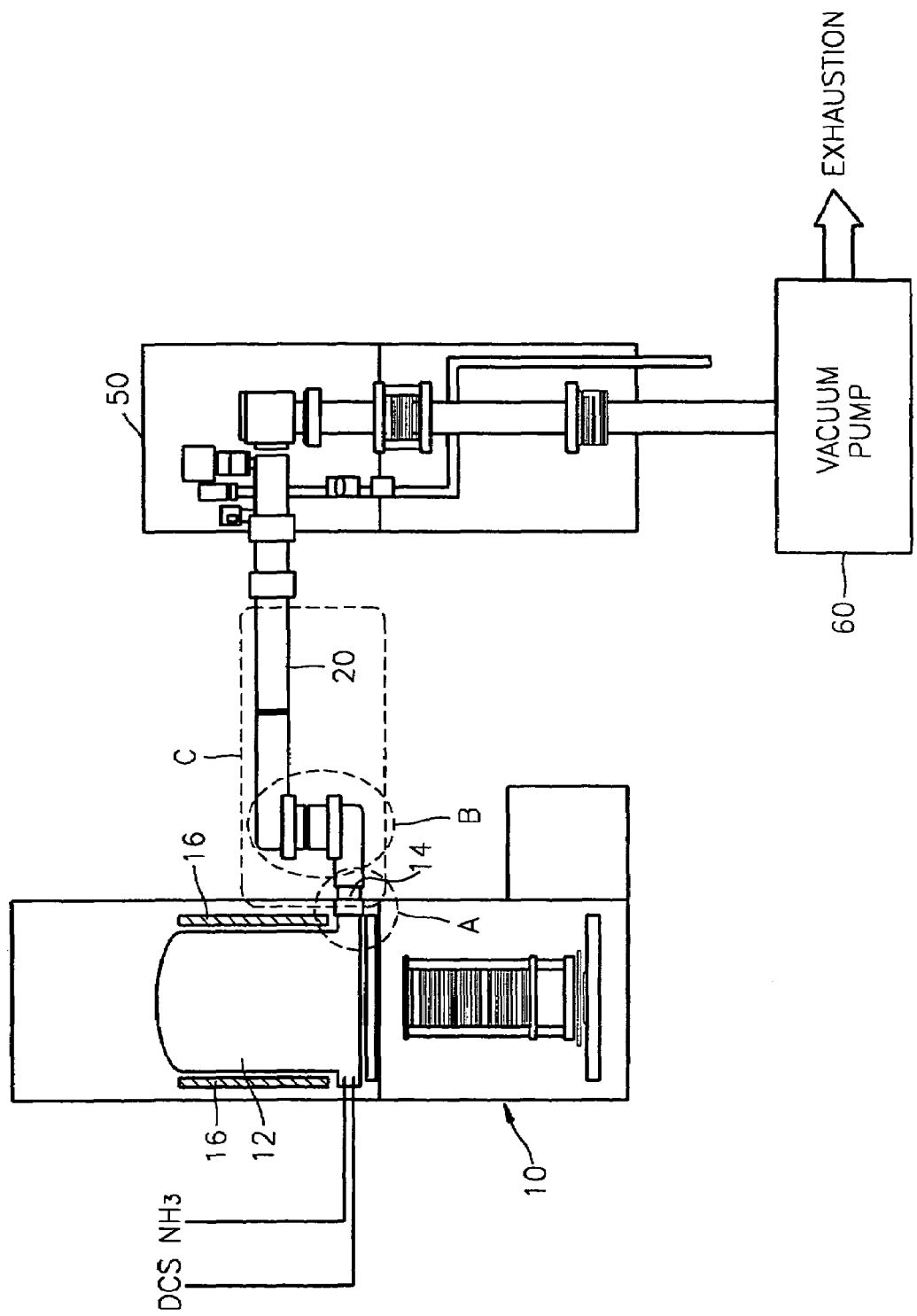
FIG. 1 is a schematic diagram of an apparatus for manufacturing a semiconductor device according to a prior art method.
Figure 2:
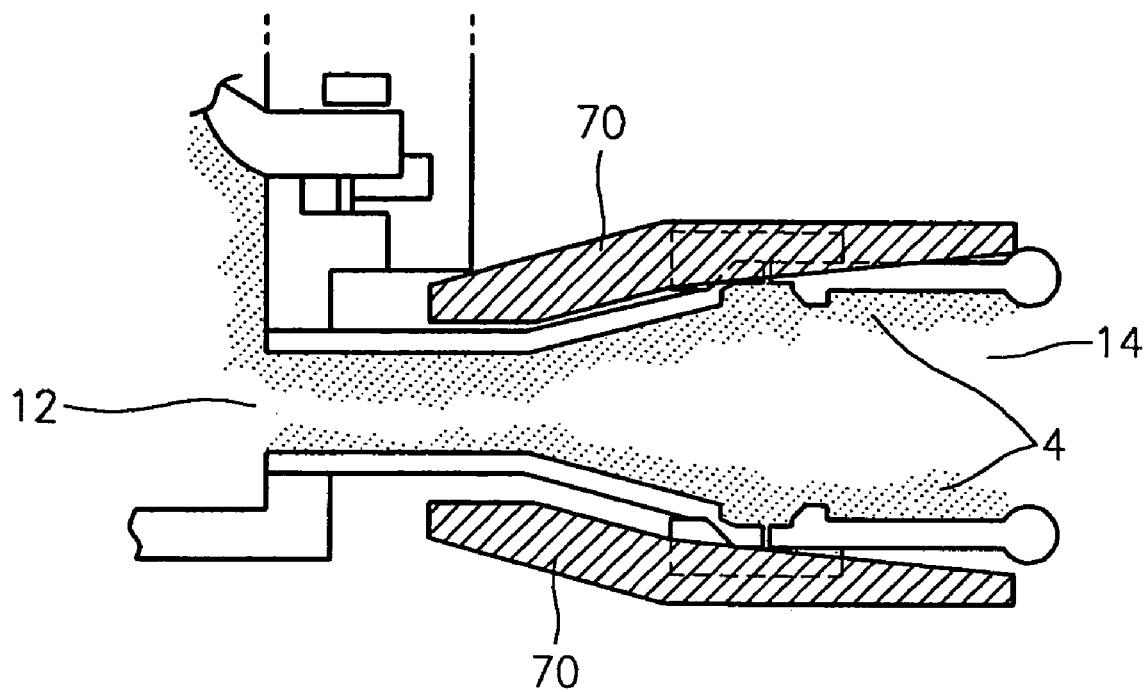
FIG. 2 is an enlarged view of a part of "A" of FIG. 1.
Figure 3:
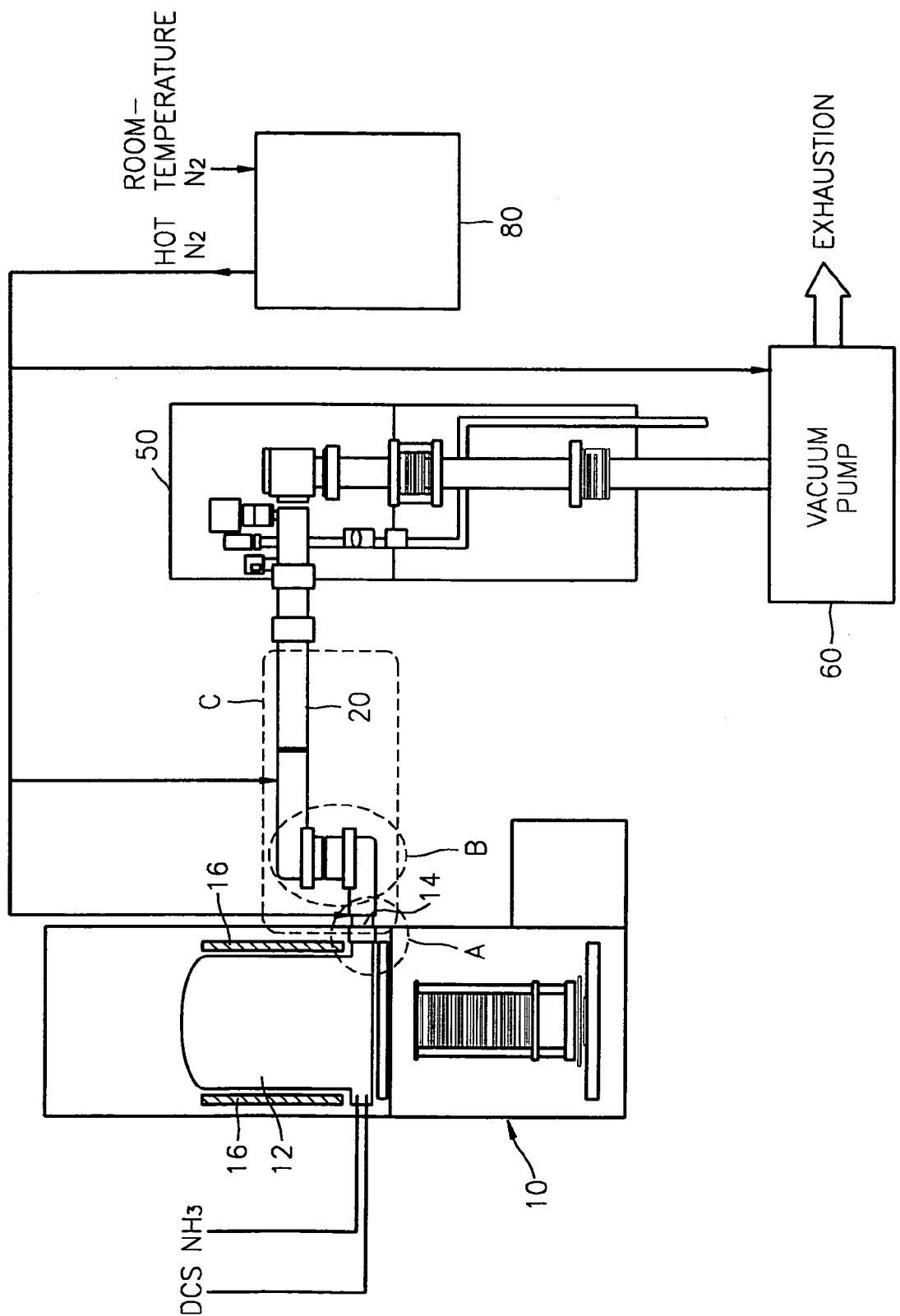
FIG. 3 is a schematic diagram of an apparatus for manufacturing a semiconductor device according to another prior art method.
Figure 4:
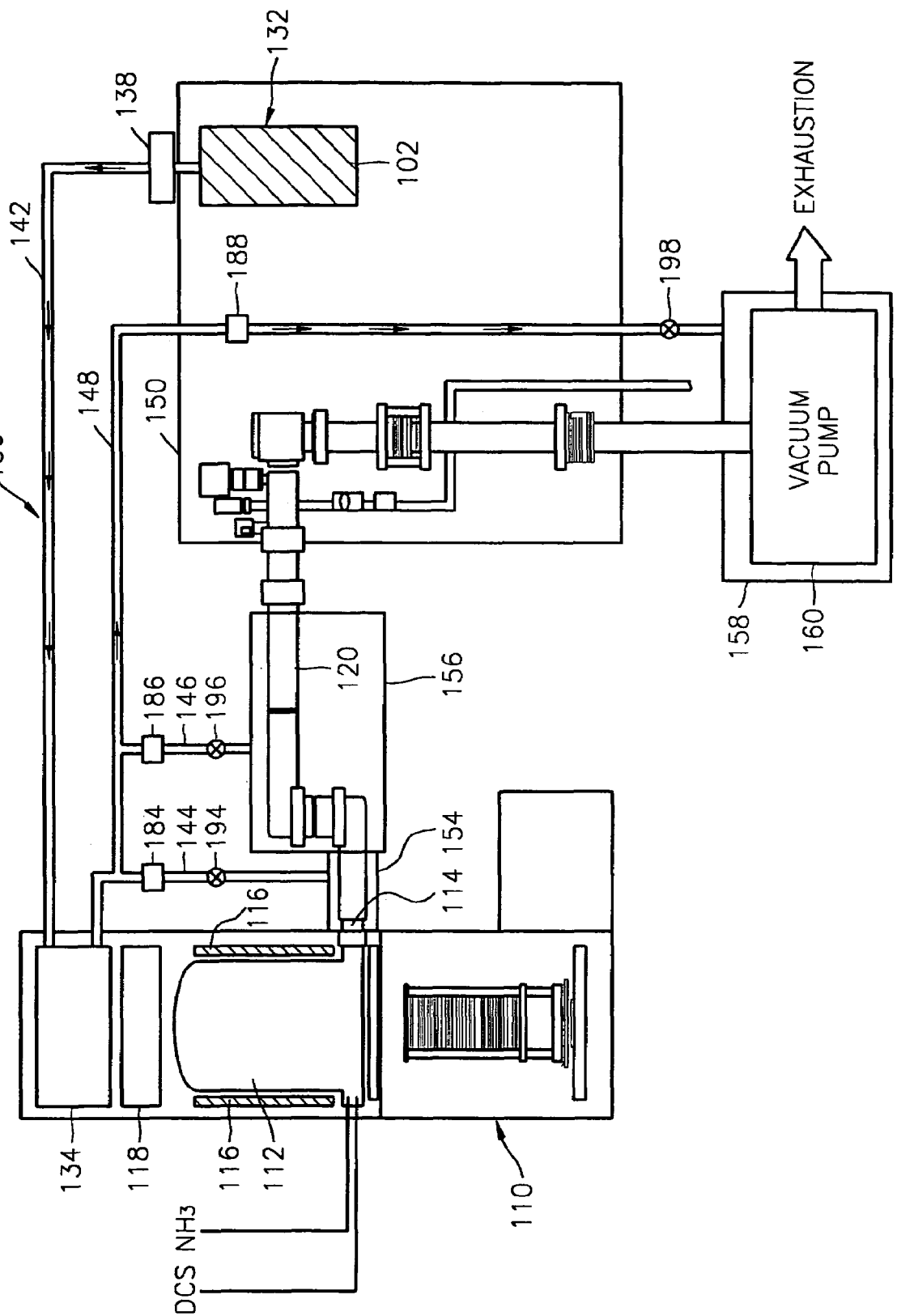
FIG. 4 is a schematic diagram of an apparatus for producing a semiconductor device according to an embodiment of the present invention.

Referring to FIG. 4, an apparatus for producing a semiconductor device according to an embodiment of the present invention is depicted. The subject apparatus comprises a reaction furnace such as a vertical-type reaction furnace 110, and a reaction chamber 112 that is contained in the reaction furnace 110. In the reaction chamber 112, a silicon nitride film is deposited on a wafer using, for example, dichlorosilane, $SiH_2Cl_2$ (DCS), and ammonia ($NH_3$). The lower portion of the reaction chamber 112 is formed with a discharge port 114, which is connected to a vacuum pump 160 via a vacuum pipe 120, for the ventilation of the reaction chamber 112. A heater 116 is installed around the reaction chamber 112 to introduce heat required for the deposition process in the reaction chamber 112. Heat from the heater 116 is supplied to the reaction chamber 112 during the deposition. Before heat from the heater 116 and the reaction chamber 112 is discharged, all or a portion of the heat passes through a hot fluid supply unit 130 and is then transferred to the discharge port 114 of the reaction chamber 112, the vacuum pipe 120, and the vacuum pump 160.

The hot fluid supply unit 130 includes a fluid container 132 for receiving a heat transfer fluid 102, a hot fluid generator 134 for transferring heat generated from the heater 116 and the reaction chamber 112 to the heat transfer fluid 102, heat transfer elements 154, 156, and 158 for transferring heat to the discharge port 114, the vacuum pipe 120, and the vacuum pump 160, respectively, using the hot heat transfer fluid 102 supplied from the hot fluid generator 134. The heat transfer fluid 102 may be a gas or liquid. Preferably, the heat transfer fluid 102 is $N_2$ gas, He gas, Ar gas, or $H_2O$. The fluid container 132 is installed in a utility box 150, which is contained in conventional semiconductor manufacture equipment.

The hot fluid generator 134 serves to transfer heat generated from the heater 116 and the reaction chamber 112 to the heat transfer fluid 102 supplied via a first pipe 142 from the fluid container 132. The hot fluid generator 134 is installed near the reaction chamber 112 in the reaction furnace 110.

Figure 5:
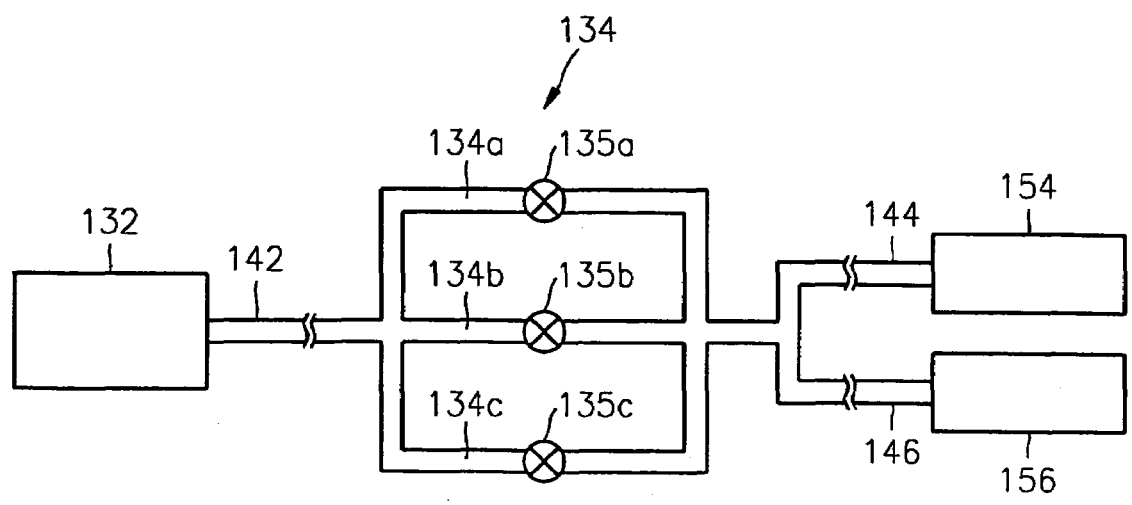
FIG. 5 is a schematic diagram of a hot fluid generator in an apparatus for producing a semiconductor device according to another embodiment of the present invention.

Referring to FIG. 5, the hot fluid generator 134 may be formed of multiple fluid channels 134a, 134b, and 134c in pipe shapes for passing the heat transfer fluid 102. The multiple fluid channels 134a, 134b, and 134c are formed with respective on/off valves 135a, 135b, and 135c for opening or closing a passage of the heat transfer fluid 102. Although there are three of each in the fluid channels (134a, 134b, and 134c) and the on/off valves (135a, 135b, and 135c) as shown in FIG. 5, the present invention is not limited thereto. As needed, the number of the fluid channels and on/off valves may vary.

Generally, the temperature of the hot fluid generator 134 varies depending on the temperature of the reaction chamber 112. However, the temperature of the hot fluid generator 134 can be separately controlled by varying the length and material of the pipes or the piping configuration.

Alternatively, the temperature of the hot fluid generator 134 can be controlled by varying the surface area of the hot fluid generator 134 through which the fluid passes. In the method of varying the surface area of hot fluid generator 134, control of the opening and closing operation of the on/off valves 135a, 135b, and 135c may be used for this purpose. That is, the temperature of the fluid can be varied depending on opening and closing of the on/off valves 135a, 135b, and 135c. For example, closing one or two of the on/off valves 135a, 135b, and 135c allows the heat transfer fluid 102, which passes through the hot fluid generator 134, to have a lower temperature, when compared to opening all the on/off valves 135a, 135b, and 135c.

In another method regarding the temperature control of the heat transfer fluid by varying a surface area of the hot fluid generator 134 through which the fluid passes. In that instance, a heated fluid is allowed to pass through a separate cooler prior to passing the discharge port 114, the vacuum pipe 120, and the vacuum pump 160.

Although the hot fluid generator 134 as shown in FIG. 5 are formed of pipes, the present invention is not limited thereto. That is, the hot fluid generator 134 may be formed of multiple panel members for passing the heat transfer fluid 102. Passages for passing the heat transfer fluid 102 may be arrayed in series, in parallel, or in combination.

The hot fluid generator 134 may be installed near the reaction chamber 112 in the reaction furnace 110, for example, at the upper portion, lower portion, or side portion of the reaction chamber 112. Preferably, the hot fluid generator 134 is installed at the upper or side portion of the reaction chamber 112 in the reaction furnace 110. More preferably, in order to achieve an optimum heat capacity and thermal stability of the reaction chamber, the reaction chamber 112, a cooler 118, and the hot fluid generator 134 can be sequentially arrayed from the bottom to the top of the reaction furnace 110, as shown in FIG. 4. Alternatively, the reaction chamber 112, the hot fluid generator 134, and the cooler 118 can also be sequentially arrayed from the bottom to the top of the reaction furnace 110. The heat transfer fluid 102 discharged from the hot fluid generator 134 may be supplied to only one portion of a semiconductor device manufacturing apparatus. However, it is preferable to supply the heat transfer fluid 102 to all of the relevant portions, i.e., the discharge port 114 of the reaction chamber 112, the vacuum pipe 120, and the vacuum pump 160.

The heat transfer fluid 102 from the hot fluid generator 134 is transferred to the discharge port 114 and the vacuum pipe 120 via second pipes 144 and 146, and to the vacuum pump 160 via a third pipe 148. The heat transfer elements 154, 156, and 158 transfer heat to the discharge port 114, the vacuum pipe 120, and the vacuum pump 160, respectively, using the heat transfer fluid 102 supplied via the second pipes 144 and 146, and the third pipe 148 from the hot fluid generator 134.

Figure 6:
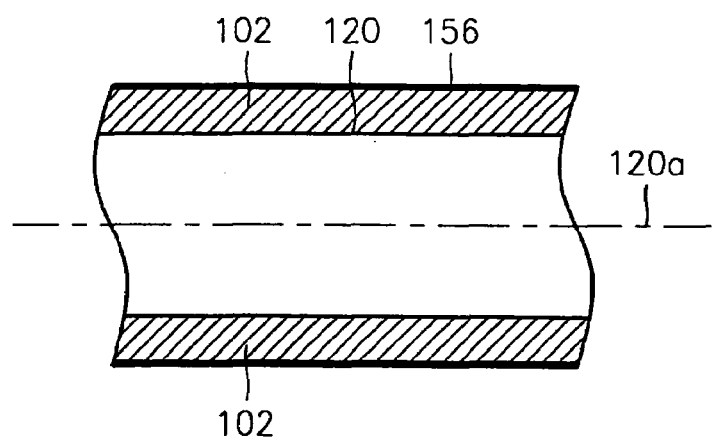
FIG. 6 is a longitudinal sectional view of a heat transfer element in an apparatus for producing a semiconductor device according to yet another embodiment of the present invention.

FIG. 6 is a longitudinal sectional view of an example of the heat transfer element 156. Although FIG. 6 illustrates only heat transfer element 156, a similar structure may be employed for the heat transfer element 154. That is, the heat transfer elements 154 and 156 have diameters larger than those of the discharge port 114 and the vacuum pipe 120, respectively, and form dual pipe structures with the discharge port 114 and the vacuum pipe 120, respectively. For example, the heat transfer element 154 or 156 can be formed of a fluid tube in a pipe shape, which extends along the same axis as the discharge port 114 or the vacuum pipe 120. In this case, the heat transfer fluid 102 flows through a space defined between the outer wall of the discharge port 114 or the vacuum pipe 120 and the inner wall of the heat transfer element 154 or 156.

Figure 7:
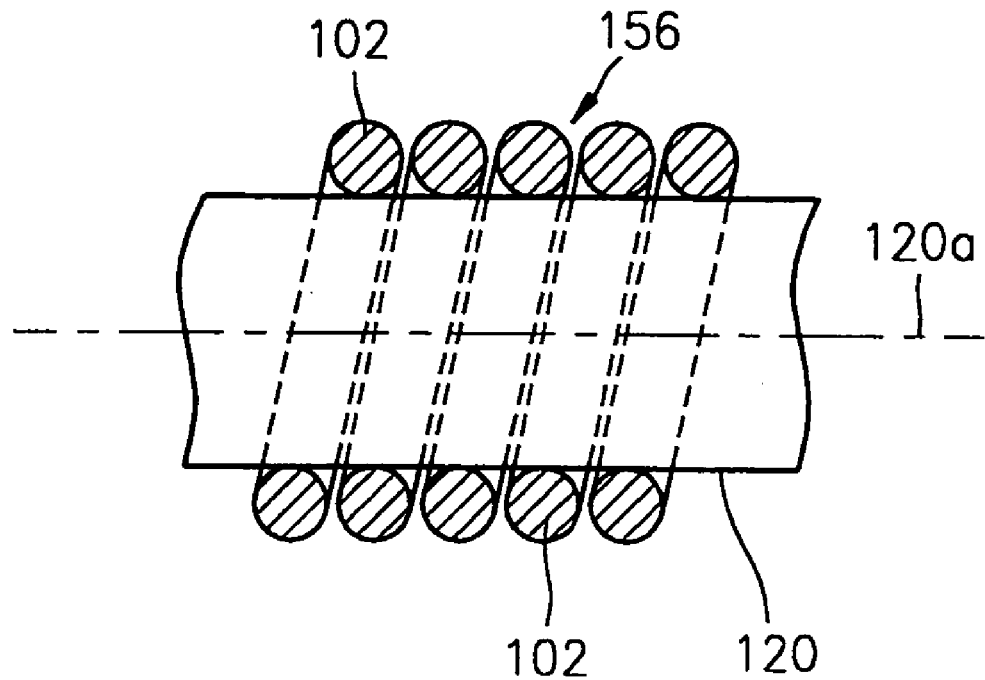
FIG. 7 is a longitudinal sectional view of another heat transfer element according to still another embodiment of the present invention.

Although FIG. 7 illustrates heat transfer element 156. However, a similar structure may be used for the heat transfer element 154. That is, the heat transfer elements 154 and 156 are formed of coiled fluid tubes, which are wound around the discharge port 114 and the vacuum pipe 120, respectively. In this case, the heat transfer fluid 102 flows inside the coiled fluid tubes. The cross sections of the fluid tubes may be circular, oval, or polygonal in construction.

Figure 8:
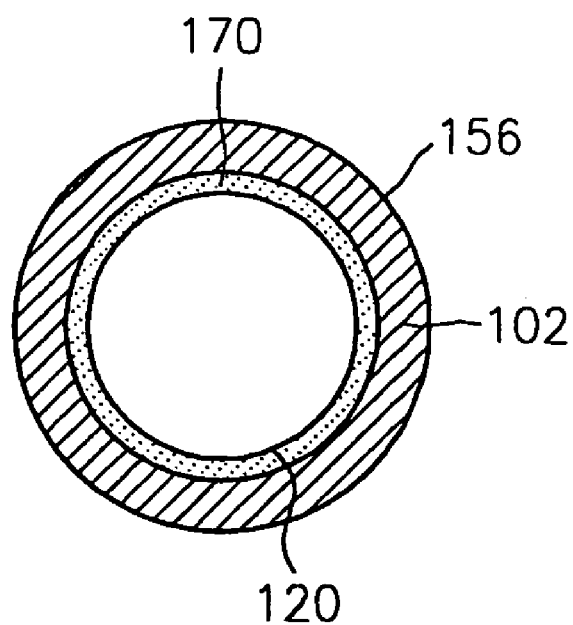
FIG. 8 is a cross sectional view a heat transfer element according to an embodiment of the present invention.

Referring to FIG. 8, a space defined between the vacuum pipe 120 and the heat transfer element 156 may be filled with a heat transfer substance 170 to facilitate the heat transfer operation. Preferably, the heat transfer substance 170 is a metal. Although not shown, a space defined between the discharge port 114 and the heat transfer element 154 may also be filled with a heat transfer substance to facilitate a heat transfer. According to the construction of the heat transfer element 156 of FIGS. 6 and 7, the vacuum pipe 120 is heated by the heat transfer fluid 102, which passes through the outer wall of the vacuum pipe 120.

There can be alternative structures of the heat transfer elements 154 and 156 which supply the heat transfer fluid 102 in a gaseous phase directly to inside the discharge pipe 114 and the vacuum pipe 120, respectively. In such gaseous heat transfer fluid supply designs, the contact surface area of the gaseous fluid is determined according to the supply location and flow rate of the gaseous fluid. In this regard, nozzles are used to ensure uniform contact of the gaseous fluid. The number of the nozzles is determined according to the shape of the discharge port 114 or vacuum pipe 120, and the degree of deposition of byproducts. The nozzles may be installed symmetrically to the left and right or to be spaced 90 or 45 degrees apart, with respect to the vacuum pipe 120, for example. Alternatively, the nozzles may be installed in the vacuum pipe 120, spaced apart from each other, and extending about central axis 120a at a predetermined radial distance within a 360 degrees range. In practice, manner of installation of the nozzles is determined according to the use of the nozzles. In addition, in order to prevent the gaseous heat transfer fluid 102 from being sprayed unevenly, diffusers may be installed at the ends of the nozzles.

As shown in FIG. 4, the first pipe 142 may comprise a flow control element 138 for controlling a flow rate of the heat transfer fluid 102, which passes through the first pipe 142. The flow control element 138 may be a mass flow controller (MFC) or a flow meter. The flow control element 138 is installed at the front side of the hot fluid generator 134, but the location thereof is not limited thereto. Therefore, the flow control element 138 may be installed at the rear side of the hot fluid generator 134. However, it is preferable to position the flow control element 138 at the front side of the hot fluid generator 134 in which the room-temperature heat transfer fluid 102 flows. The number of the flow control elements 138 may be selected based on factors such as the cost incurred and the ultimate end use. In addition, because the flow control element 138 may undergo substantial changes in the flow rate when switched from a closed mode to an opened mode, it is preferable to use a flow control element 138 which can be set at a slower initial flow rate. Then, the actual operating flow rate can be set for the particular end use.

The second pipes 144 and 146 and the third pipe 148, which transfer the heat transfer fluid 102 from the hot fluid generator 134 to the respective discharge port 114, vacuum pipe 102, and vacuum pump 160, include respective on/off valves 194, 196, and 198 for opening and closing a passage of the heat transfer fluid 102. The flow of the fluid, which passes through the second pipes 144 and 146, and the third pipe 148, can be controlled by on/off operation of the on/off valves 194, 196, and 198. In addition, the second pipes 144 and 146, and the third pipe 148 may include respective thermocouples 184, 186, and 188 for sensing and monitoring the temperature of the heat transfer fluid 102, which passes through these pipes 144, 146, and 148.

The apparatus of the present invention may further comprise a main controller for opening or closing multiple on/off valves 135a, 135b, and 135c formed at the multiple fluid pipes 134a, 134b, and 134c according to temperature data of the heat transfer fluid 102 sensed by the thermocouples 184, 186, and 188. That is, when the temperature data of the heat transfer fluid 102 sensed by the thermocouples 184, 186, and 188 are transmitted to the main controller, the on/off valves 135a, 135b, and 135c are opened or closed by a signal emitted from the main controller. In this way the flow rate and temperature, the gaseous or liquid heat transfer fluid 102 is supplied in a controlled manner to the discharge port 114, the vacuum pipe 120, and the vacuum pump 160.

As apparent from the above descriptions, in the semiconductor device manufacture apparatus of the present invention for carrying out a deposition process on a wafer, preferably using a vertical-type reaction furnace, all or a portion of the heat generated from the reaction chamber can be transferred to a discharge port of the reaction chamber, a vacuum pipe, and/or a vacuum pump using a heat transfer fluid, before the heat is discharged out of the furnace. Therefore, generation of undesirable byproducts can be prevented, for example, at a low temperature area.

More specifically, the semiconductor device manufacturing apparatus of the present invention can prevent the generation of, for example, ammonium chloride using all or a portion of the heat generated in the reaction chamber, without the use of an external heat supply, in an inexpensive and efficient manner. Therefore, a thin film with high quality can be deposited on a wafer and deposition efficiency can be increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for producing a semiconductor device, comprising: a reaction chamber installed in a reaction furnace; a discharge port for removing from the reaction chamber reaction byproducts formed during production of the semiconductor device; a heater for generating heat to heat the reaction chamber; a hot fluid supply unit for introducing heat from the heater and the reaction chamber into the discharge port, the hot fluid supply unit comprising a fluid container for receiving a heat transfer fluid; a hot fluid generator adjacent the reaction chamber inside the reaction furnace, the hot fluid generator defining a fluid channel for conveying the heat transfer fluid and transfers heat generated from the heater and the reaction chamber to the heat transfer fluid supplied from the fluid container; and a heat transfer element for transferring heat to the discharge port using the heat transfer fluid supplied from the hot fluid generator.

2. The apparatus according to claim 1, wherein the hot fluid generator comprises a conduit that defines the fluid channel.

3. The apparatus according to claim 1, wherein the hot fluid generator comprises multiple fluid channels, each of said fluid channels including an on/off valve for opening or closing a passage for the heat transfer fluid.

4. The apparatus according to claim 1, wherein the hot fluid generator is located at an upper portion of the reaction chamber.

5. The apparatus according to claim 1, wherein the hot fluid generator is located at a side portion of the reaction chamber.

6. The apparatus according to claim 1, wherein the discharge port is connected to a vacuum pump via a vacuum pipe, and the heat transfer element comprises first and second fluid conduits, the first fluid conduit having a diameter larger than that of the discharge port, and forming a first structure with the discharge port which extends along the same axis as the discharge port, and the second fluid conduit having a diameter larger than that of the vacuum pipe, and forming a second structure with the vacuum pipe which extends along the same axis as the vacuum pipe.

7. The apparatus according to claim 6, wherein the heat transfer element is formed of a plurality of coil-shaped fluid conduits that are wound about the discharge port and the vacuum pipe.

8. The apparatus according to claim 7, wherein the spaces between the coil-shaped fluid conduits and the discharge port and vacuum pipe, respectively, are filled with a substance for facilitating heat transfer.

9. The apparatus according to claim 8, wherein the heat transfer substance comprises a metal.

10. The apparatus according to claim 1, wherein the heat transfer fluid comprises a gas or liquid.

11. The apparatus according to claim 10, wherein the heat transfer fluid comprises $N_2$ gas, He gas, Ar gas, or $H_2O$.

12. The apparatus according to claim 6, wherein when the heat transfer fluid is a gas, and the heat transfer element comprise nozzles for supplying the heat transfer fluid to the discharge port and the vacuum pipe.

13. The apparatus according to claim 1, the fluid container is disposed within a utility box.

14. The apparatus according to claim 1, further comprises a flow control element for controlling a flow rate of the heat transfer fluid from the fluid container.

15. The apparatus according to claim 14, wherein the flow control element is one of a mass flow controller and a flow meter.

16. The apparatus according to claim 1, which comprises a thermocouple for sensing and monitoring the temperature of the heat transfer fluid from the hot fluid generator.

17. The apparatus according to claim 16, further comprising a main controller for opening or closing an on/off valve formed at the multiple fluid channels based on the temperature of the heat transfer fluid which is sensed by the thermocouple.

18. The apparatus according to claim 1, wherein the reaction chamber is a deposition chamber for forming a silicon nitride film on a wafer using dichlorosilane and ammonia.

19. The apparatus according to claim 6, further comprising a conduit for transferring the heat transfer fluid from the hot fluid generator to the vacuum pipe.

20. The apparatus according to claim 19, which further comprises an on/off valve for permitting or preventing the flow of the heat transfer fluid supplied from the hot fluid generator.

21. The apparatus according to claim 1, wherein the heater is formed within the furnace adjacent the reaction chamber.

* * * * *